United States Patent [19]
Jeong et al.

[11] Patent Number: 5,990,692
[45] Date of Patent: Nov. 23, 1999

[54] TESTING APPARATUS FOR NON-PACKAGED SEMICONDUCTOR CHIP

[75] Inventors: Hwa Jin Jeong, Suwon; Young Ho Kim, Pusan, both of Rep. of Korea

[73] Assignee: Samsung Electronics Co., Ltd., Suwon, Rep. of Korea

[21] Appl. No.: 08/853,906

[22] Filed: May 9, 1997

[30] Foreign Application Priority Data

May 10, 1996 [KR] Rep. of Korea ..................... 96-15463

[51] Int. Cl.[6] .................................................. G01R 31/02
[52] U.S. Cl. .......................... 324/755; 324/765; 439/266
[58] Field of Search ................... 324/754, 755, 324/765, 758, 158.1; 439/266, 267, 68, 71

[56] References Cited

U.S. PATENT DOCUMENTS

| | | |
|---|---|---|
| 5,006,792 | 4/1991 | Malhi et al. |
| 5,479,105 | 12/1995 | Kim et al. |
| 5,548,884 | 8/1996 | Kim. |
| 5,559,444 | 9/1996 | Farnworth ............................. 324/754 |
| 5,572,140 | 11/1996 | Lim ........................................ 324/755 |
| 5,633,122 | 5/1997 | Tuttle .................................... 324/765 |
| 5,705,933 | 1/1998 | Lim ........................................ 324/755 |
| 5,721,496 | 2/1998 | Farnworth ............................. 324/755 |
| 5,825,195 | 10/1998 | Hembree ............................... 324/755 |
| 5,844,418 | 12/1998 | Wood .................................... 324/755 |
| 5,847,572 | 12/1998 | Iwasaki ................................. 324/754 |

*Primary Examiner*—Maura Regan
*Attorney, Agent, or Firm*—Jones Volentine, L.L.P.

[57] ABSTRACT

A non-packaged semiconductor chip testing apparatus includes a lead frame having chips with a plurality of leads which are electrically isolated from the other leads, and are supported by adhesive tape and bonded to the chip via wires. The lead frame is placed on a holding plate having windows, so that the leads of the lead frame are exposed through the windows and contact test probes located under the plate. The test probes, such as pogo pins or bending leads, extend upwardly from a substrate. A base receives the substrate, with cables extending from a lower surface of the substrate passing through openings in the base, where they then connect a test board. After being pressed down by a pressing cover, the lead frame on the holding plate moves down so that the leads may contact the test probes. The pressing cover is movable up and down. Guide pins on the base are simultaneously inserted into through holes of the holding plate and lead frame, and extend into recesses in the pressing cover to ensure alignment.

13 Claims, 9 Drawing Sheets

TESTING APPARATUS FOR NON-PACKAGED SEMICONDUCTOR CHIP

BACKGROUND OF THE INVENTION

1. Field of the Invention

The present invention relates generally to a testing apparatus for semiconductor devices, and more particularly, to an apparatus which is used to perform an alternating current (AC) test and a burn-in test on non-packaged or bare semiconductor chips.

2. Description of the Related Art

The semiconductor industry is now producing multi-chip modules (MCM) in which multiple semiconductor chips are mounted on a circuit board, rather than utilizing a single chip package. The multi-chip module (MCM) have several advantages including faster operating speeds, larger capacity, and higher integration densities.

Although these advantages are significant, the MCM suffers some drawbacks. As compared with the single chip package technique, the MCM has an increased integration scale, but the production yield is significantly decreased. Such a low yield means that an undesirably large quantity of material must be discarded or reworked, which is very expensive and labor intensive.

Therefore, it is important to identify known good die (KGD) to increase the production yield of the MCM. Known good die (KGD) are semiconductor chips which are not packaged but which have proven to be reliable after completing tests at the same level as the conventional package technique. The successful development of the MCM depends on the availability of the KGD.

Semiconductor chips are generally subjected to a series of test procedures in order to assure the reliability of the chips. One of these test procedures is an AC test in which all input and output terminals are connected to a test signal generating circuit to verify the transferring characteristics between the incoming and outgoing signals.

Another test is a burn-in test in which a given chip is overstressed, that is, the chip is subjected to higher than normal operating temperatures and voltages to verify its lifetime. These tests allow a manufacturer to identify defective chips and preclude potential failures which may occur after assembly or processing.

However, bare chips do not have external leads so it is difficult to electrically connect a non-packaged chip or a bare chip to the test signal generating circuit unless the chip is packaged. Thus, the tests are generally carried out by packaging the chip with external leads connected to chip pads, and connecting the external leads to a test socket, which is then mounted onto a test board. But, this test technique has disadvantages such as the cost involved in packaging a potentially inferior chip. Also, the tests are performed on one chip at a time, which limits the number of bare chips that may be tested in a given amount of time.

An apparent solution to these problems was proposed in U.S. Pat. No. 5,006,792, which provides a flip chip test socket adapter to perform the AC and burn-in tests with a bare chip, in which a plurality of solder bumps are formed on the bonding pads of the chip. As stated in the '792 patent, the flip chip is inserted into the test socket adapter and is subjected to the tests. The test socket adapter includes a substrate provided with cantilever beams to accommodate silicon substrates that are not perfectly flat or solder bumps that are not identical in size. The test socket adapter allows the bare chip to be tested prior to being packaged.

However, in this conventional technique, expensive chip test equipment must be provided so as to precisely form the solder bumps on the bonding pads of the chip due to a fine pitch between the bonding pads. Another problem is that the chip test is performed on only one chip at a time in order to assure the reliability. Thus, the cost for one validating a KGD is increased and the testing procedure is not advantageous for producing a large number of the KGDs. Furthermore, the chip must be individually handled during the test which makes it more difficult. Moreover, whenever the structure of the chip to be tested is changed, the structure of the above-described socket adapter must also be modified to correspond to different configurations of bonding pads.

Another technique for testing the bare chip is disclosed in U.S. Pat. No. 5,479,105 which provides a die testing apparatus including a lead frame which has bare chips mounted on die pads. The die pads are supported by tie bars and the leads are supported by an adhesion tape. The bare chips are connected to leads through wires. The lead frame is placed in a test socket which includes an under socket and an upper socket. The under socket has slot grooves and the upper socket, which is connected via a hinge with the under socket, has slot holes and test probes contacting the leads of the lead frame. The lead frame is fixed between the upper and under sockets by means of pins penetrating the slot holes and guiding holes located at a periphery of the lead frame, and then being inserted into the slot grooves. One side of the lead frame is fixed between the upper and under sockets by a clamp. The test socket, which has a plug portion with electrical contacts thereon, is located at an edge of the socket so that it can be plugged into a testing board.

Although this testing technique overcomes the problems of the above-described technique, it still suffers some drawbacks. First, since the plug portion of this test socket must be perpendicularly inserted into a test board, the lead frame having the bare chips connected to leads through the wires is oriented in an upright position. Accordingly, the wires are liable to break under harsh environments. Second, pins must be inserted through the slot holes, guiding holes and the slot grooves whenever the test socket is closed, which takes time and lowers productivity.

SUMMARY OF THE INVENTION

The present invention provides an improved apparatus for testing non-packaged semiconductor chips at a low cost, regardless of the number of chips to be tested or the configuration of the bonding pads of the chip. In addition, with the present invention, such tests are carried out under stable conditions.

To achieve these and other advantages and in accordance with the purpose of the invention, as embodied and broadly described, the invention broadly provides a testing apparatus comprising a lead frame having chips, a plate for holding the lead frame, substrates having test probes, a base for receiving the substrates, and a cover for pressing the lead frame downwardly. The lead frame has a plurality of leads which are electrically isolated from the other leads and physically supported by adhesive tape. At least one semiconductor chip to be tested is bonded to the leads by means of wires. The lead frame may include groups of leads that respectively belong to one chip and are electrically separated from the other groups. Each group of leads may include a pad for mounting the chip thereon.

The holding plate has a plurality of windows which are formed so that the leads of the lead frame are exposed therethrough. The test probes on the substrate contact the leads exposed through the windows of the holding plate. A securing layer having probe holes may be formed on the substrate for receiving the test probes. The test probes may be resilient pogo pins or elastic bending leads. The substrate also includes cables for connecting the test probes to test signal generating circuits.

The base comprises upper openings for receiving the substrate and lower openings for passing the cables therethrough. The upper openings are larger than the lower openings, and thus the substrate is inserted in the upper openings and then mounted. The base may include springs for resiliently joining the holding plate therewith. The cover is located above the lead frame in order to press it downwardly. The pressing cover has recessed cavities which protect the bonding wires.

The testing apparatus of the present invention may further comprise a moving or driving means. The driving means is fixed to the pressing cover to move it up and down.

The testing apparatus of the present invention may also comprise at least one guide pin on the base surrounding the upper openings. The guide pins on the base penetrate through respective holes in the holding plate and lead frame, and are then inserted into recesses of the pressing cover to ensure proper alignment.

DETAILED DESCRIPTION OF PREFERRED EMBODIMENTS OF THE INVENTION

Figure 1:
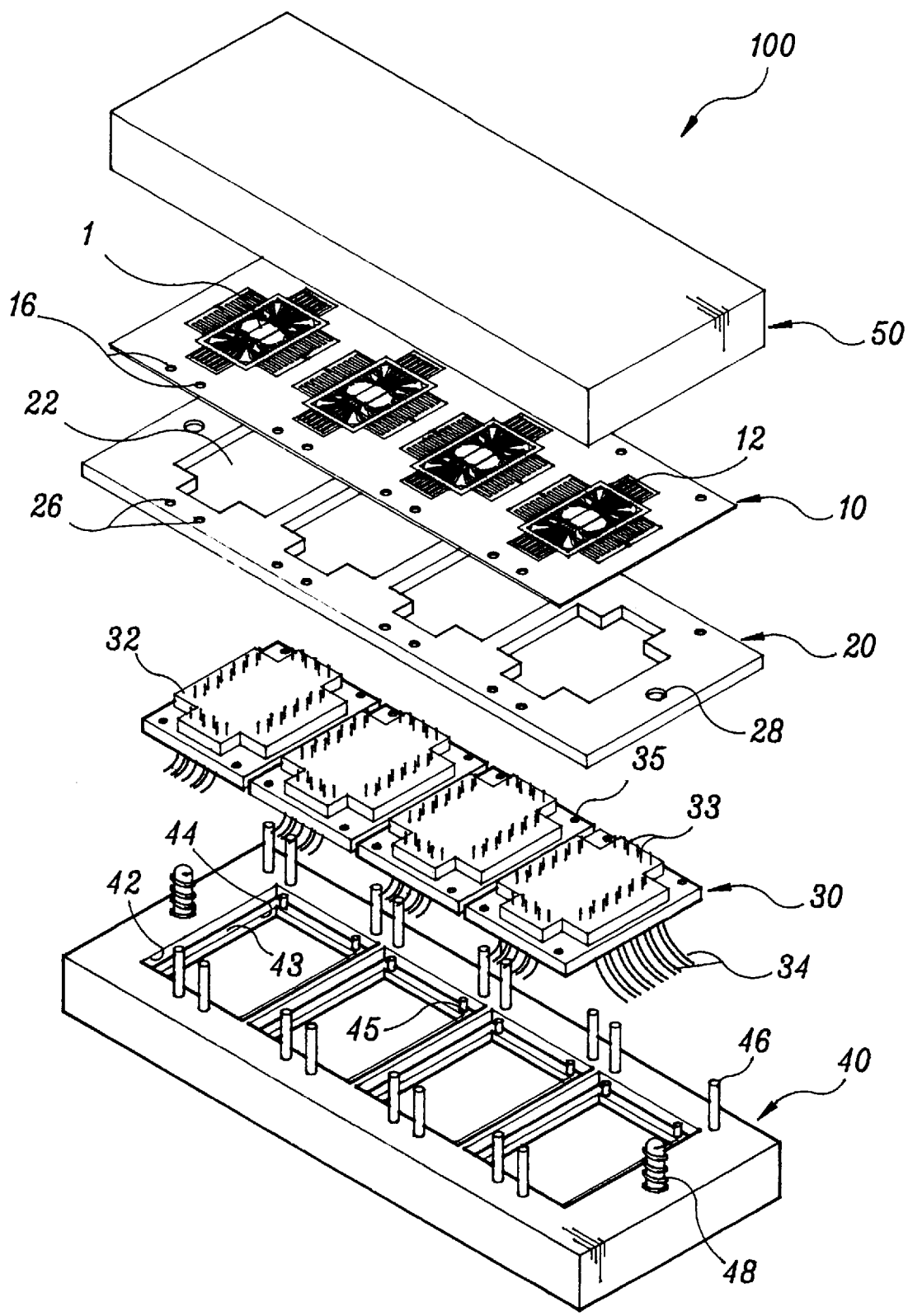
FIG. 1 is an exploded perspective view illustrating the spatial relation between the elements of a testing apparatus for non-packaged semiconductor chips according to the present invention.

The present invention will now be described more fully hereinafter with reference to accompanying drawings, in which preferred embodiments of the invention are shown. This invention may, however, be embodied in many different forms and should not be construed as limited to the embodiments set forth herein. In the drawings, like numbers refer to like elements throughout.

Figure 2:
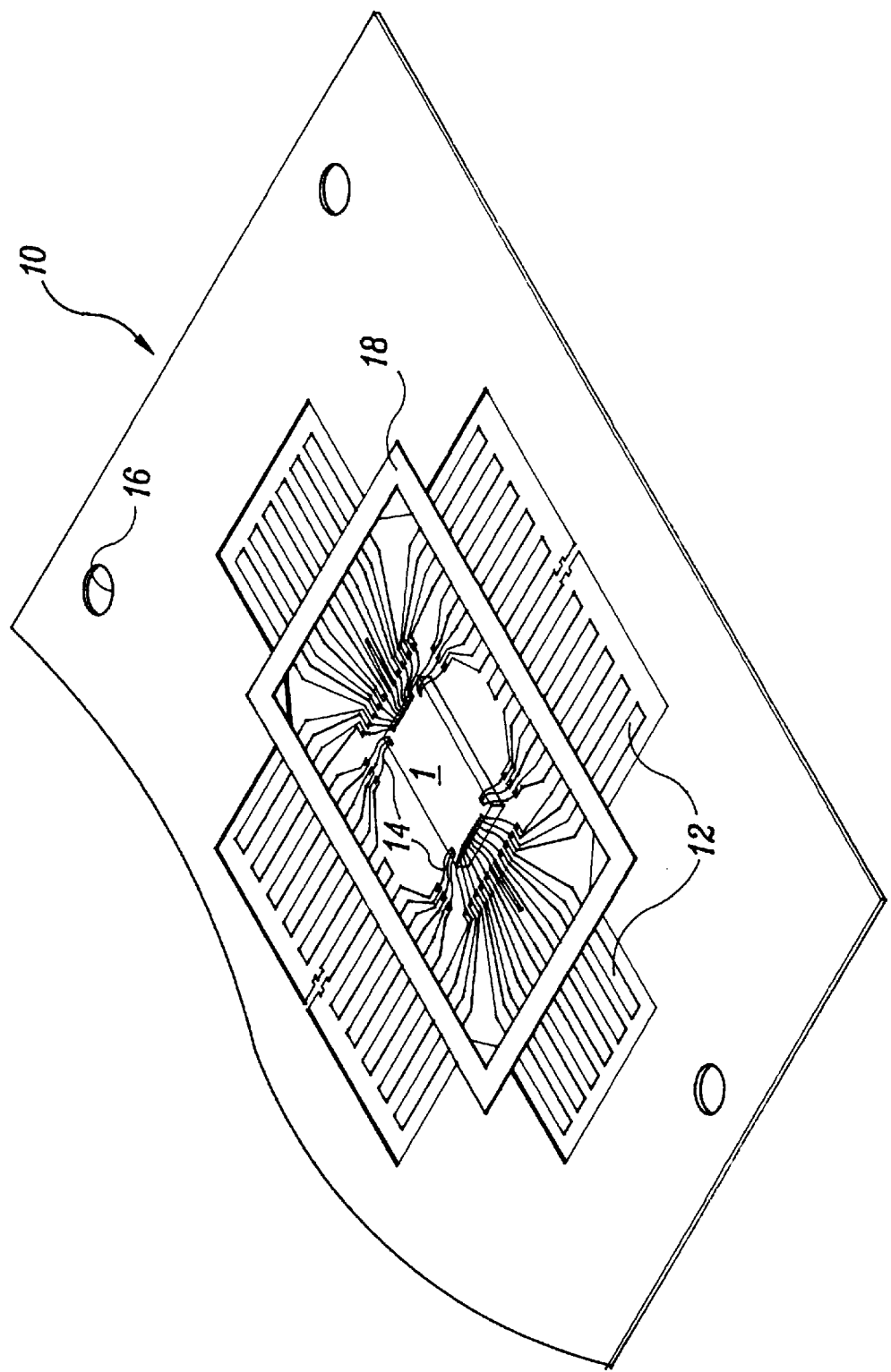
FIG. 2 is a enlarged perspective view showing a lead frame utilized in the testing apparatus of FIG. 1.

FIG. 1 illustrates the spatial relation between the main elements of a testing apparatus 100 for non-packaged or bare semiconductor chips 1 according to the present invention, and FIG. 2 shows a lead frame 10 utilized in the testing apparatus 100 of FIG. 1. Referring to FIG. 1, the testing apparatus 100 comprises a lead frame 10 which includes at least one semiconductor chip to be tested. The lead frame 10 has a plurality of leads 12, as shown in FIG. 2, and an electrically non-conductive adhesive tape 18 overlying the leads 12. Each of the leads 12, or each group of the leads belonging to the chip 1 is electrically isolated from the other leads or groups of leads, as well as lead frame 10, and physically supported by the adhesive tape 18. The chip 1 is surrounded by the leads 12 and then bonded to the leads 12 by means of bonding wires 14. Guide holes 16 permit the lead frame 10 to be positioned for testing.

The lead frame 10 may have no die pad, as known from FIG. 2. The other side of the lead frame 10 could include a die pad, as illustrated and described in U.S. Pat. No. 5,548,884, for METHOD OF MANUFACTURING A KNOWN GOOD DIE ARRAY, by Il U. Kim, which is incorporated herein by reference in its entirety. If a chip-mounting pad is not used, however, the chip may be mechanically and electrically connected to the leads by means of the wires as set forth previously.

The lead frame 10 is then placed on a holding plate 20. In order to hold the lead frame 10, through holes 26 are provided in the holding plate 20, corresponding to the guide holes 16 of the lead frame 10. The leads 12 of the lead frame 10 are exposed through windows 22 formed in the holding plate 20, so that the leads 12 can be connected with a corresponding substrate 30 located below.

The substrate 30 includes a plurality of test probes 33 that contact the leads 12 of the lead frame 10 through the window 22 of the holding plate 20. The test probes 33 extend upwardly from the substrate 30, and each of the test probes 33 is connected to a respective one of cables 34 extending downwardly from the substrate 30. The plurality of cables 34 again are in turn connected to test signal generating circuits (not shown) for use in routing electrical signals to and from the chip 1.

Figure 7:
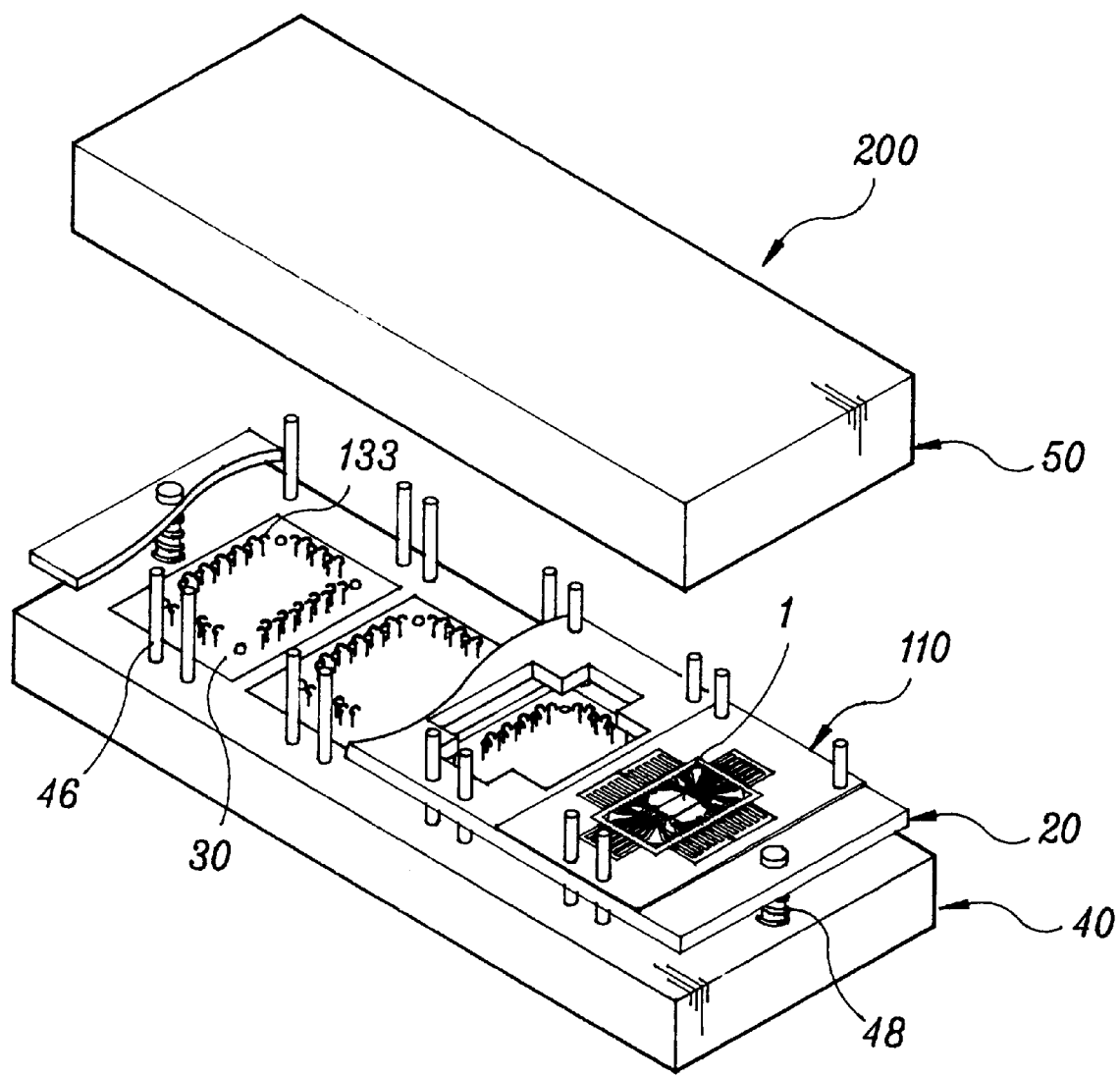
FIG. 7 is a partially cut away and exploded perspective view illustrating the spatial relation between the elements of another embodiment of a testing apparatus for non-packaged semiconductor chips according to the present invention.
Figure 8:
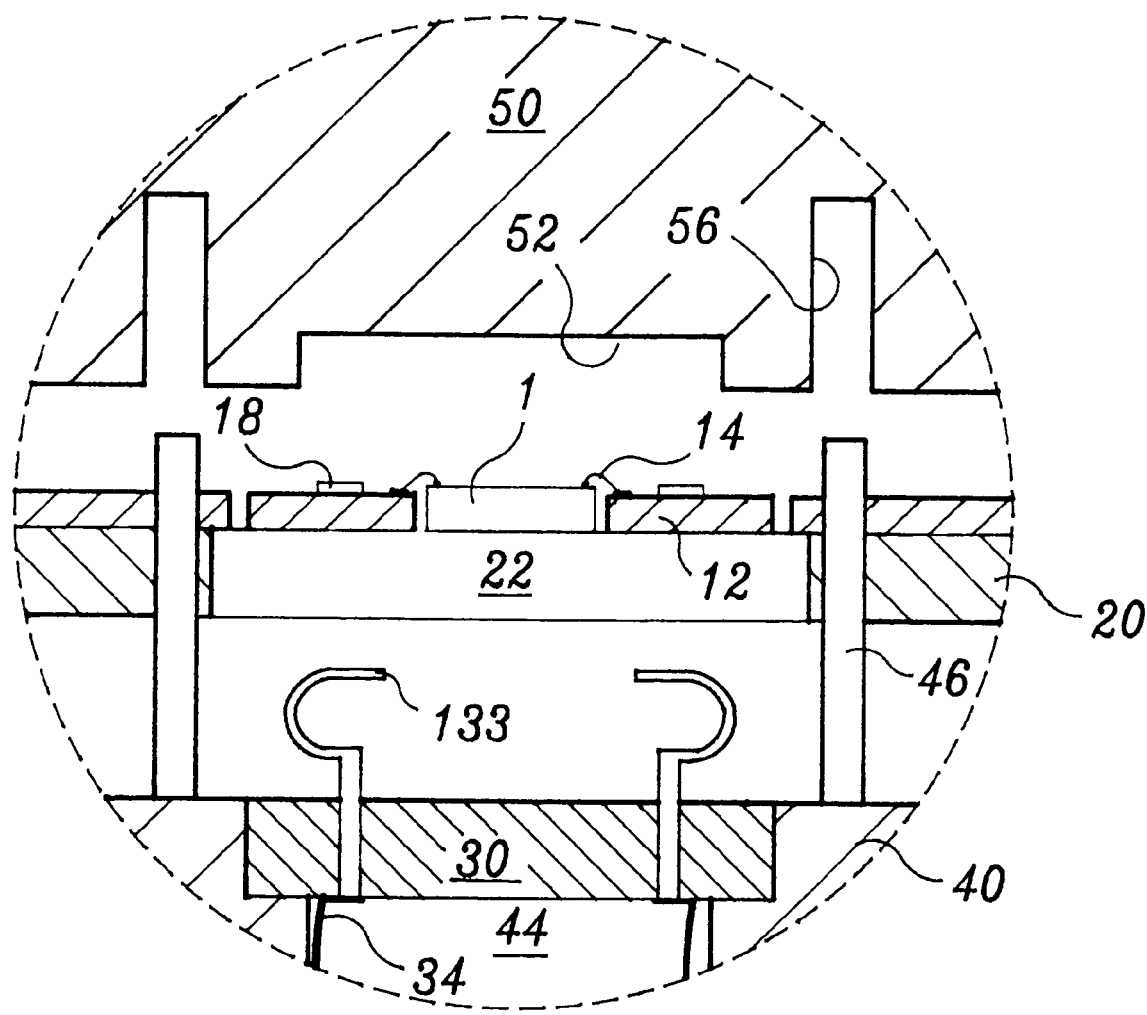
FIG. 8 is a schematic cross-sectional view showing parts of the testing apparatus of FIG. 7.

Either the resilient pogo pins, as employed in the present embodiment, or elastic bending leads, as alternatively shown in the embodiment of FIGS. 7 and 8, may be used as the test probes 33.

A securing layer 32 may be provided on the substrate 30 so as to secure the test probes 33. In this case, the test probes 33, comprising the pogo pins, are inserted into probe holes in the securing layer 32. The securing layer 32 is preferably made of a material such as a polyimide so as to prevent the securing layer 32 from transforming due to heat generated during the test.

The substrates 30 are inserted into openings 47 of a base 40. The openings 47 are respectively divided into two sections, i.e., upper openings 42 and lower openings 44. Since each upper opening 42 is larger in size than lower opening 44, each substrate 30 can be mounted on a top surface 43 adjacent the lower opening 44. As the substrate 30 is received in the upper opening 42, the cables 34 pass through the lower opening 44.

Guide pins 46 and springs 48 may be formed along the peripheral area surrounding the upper opening 42 of the base 40. Each guide pin 46 is simultaneously inserted into the through hole 26 of the holding plate 20 and the guide hole 16 of the lead frame 10. The springs 48 resiliently joins the holding plate 30 with the base 40, so that the holding plate 30 can be moved up and down. In the holding plate 20, apertures 28 for joining the spring 48 may be provided. Moreover, fasteners 45 and related apertures 35 can be respectively provided on the base 40 and in the substrate 30 so that the substrate 30 is securely mounted in the upper opening 42 of the base 40. The base 40 is preferably made from materials such as fiberglass having a low thermal expansion coefficient (TEC) so that it will not be affected by heat generated during the testing procedure.

Figure 3:
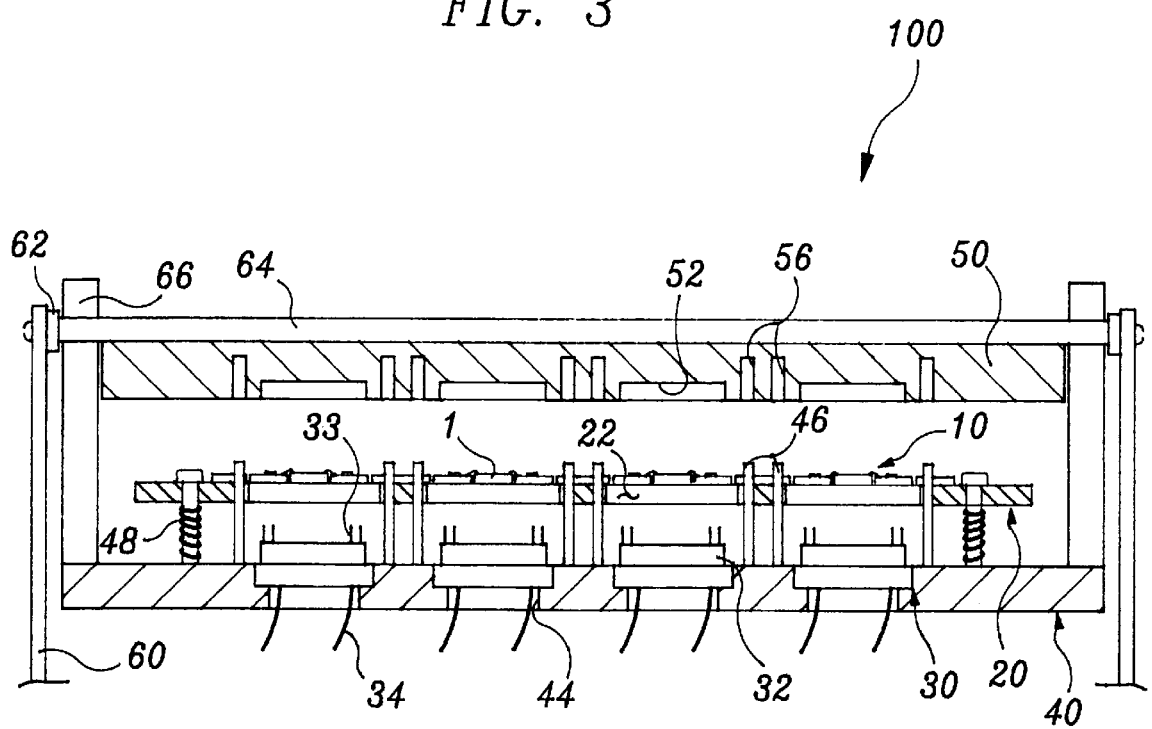
FIG. 3 is a schematic cross-sectional view showing the entire testing apparatus according to the present invention.
Figure 4A:
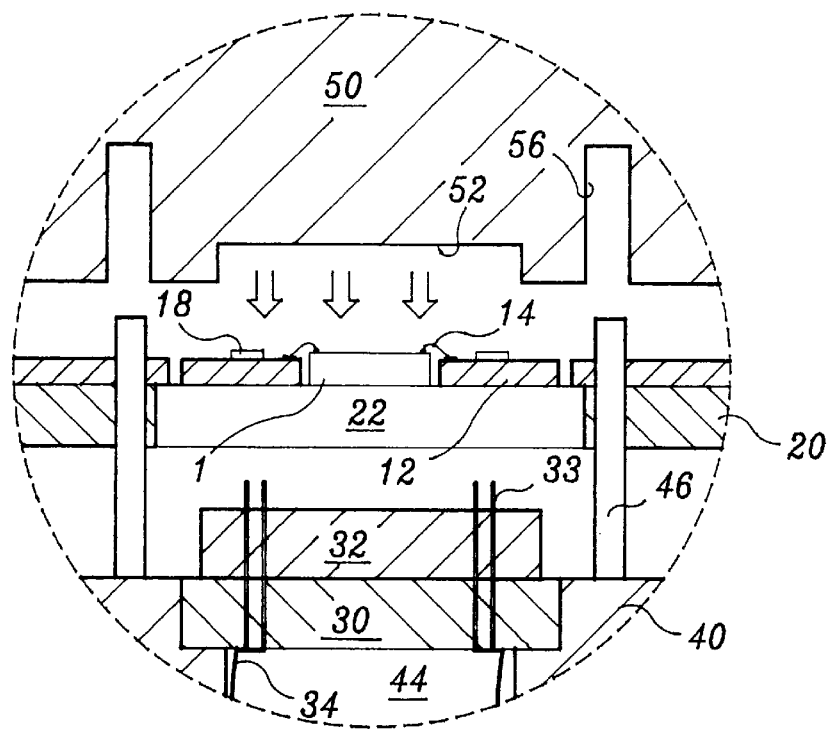
FIGS. 4A and 4B are enlarged cross-sectional views showing the process for testing non-packaged semiconductor chips by using the testing apparatus of FIG. 3.
Figure 4B:
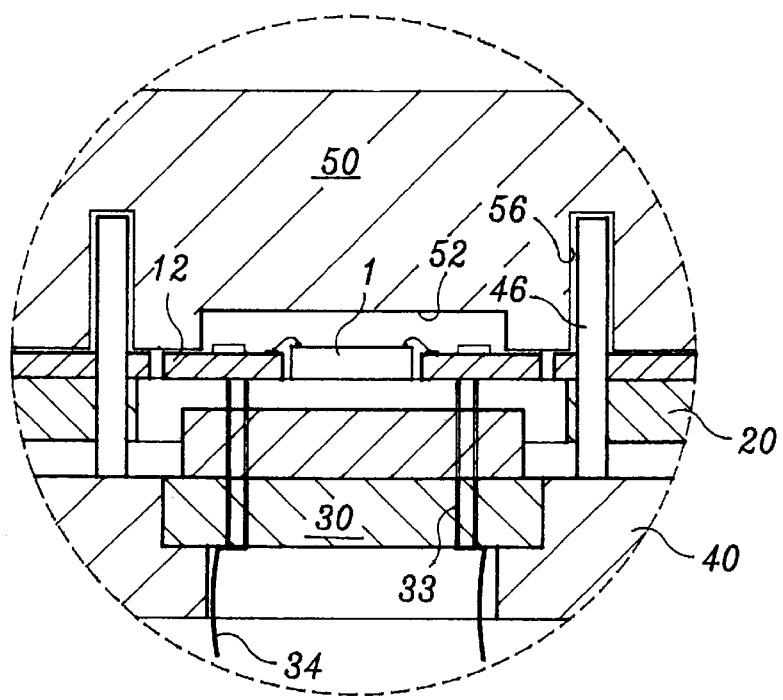

Above the lead frame 10, a cover 50 presses down the lead frame 10. On the lower surface of the pressing cover 50, cavities 52 and recesses 56, as shown in FIGS. 3, 4A and 4B, are formed. The wires 14 which connect the chip 1 to the leads 12 of the lead frame 10 are protected by the cavities 52 when the lead frame 10 is pressed by the pressing cover 50. Each recess 56 accommodates the respective guide pin 46 which penetrates the respective guide hole 16 and the through hole 26. The pressing cover 50 is made from electrically non-conductive materials.

With the above configuration, the recesses 56, guide pins 46 on the base 40, guide holes 16 in the lead frame 10, and through holes 26 in the holding plate 20 are all in alignment. In addition, base 40, substrates 30, holding plate 20, lead frame 10, and pressing cover 50 are arranged horizontally. Since the non-packaged chip 1 and the leads 12 of the lead frame 10 are located on the same horizontal level and wire-bonded, the testing procedure according to the present invention may be carried out under stable conditions.

FIG. 3 schematically illustrates the entire testing apparatus 100 according to the present invention, and FIGS. 4A and 4B show a process for testing non-packaged semiconductor chips 1 by using the testing apparatus 100 of FIG. 3.

In addition to the elements of FIG. 1 described previously, the testing apparatus 100 in FIG. 3 further comprises a means 60 for positioning and driving the pressing cover 50. The driving means 60 is fixed to the pressing cover 50. Reference numerals 60, 62, 64 and 66 in FIG. 3 designate the driving means and related elements, which will be described in greater detail later.

As shown in FIGS. 3, 4A and 4B, the substrate 30, which includes the securing layer 32, the test probes 33, for example, the pogo pins, and cables 34, is inserted into the upper opening 42, shown in FIG. 1, of the base 40. The lead frame 10 on the holding plate 20 is located between the substrate 30 and the pressing cover 50. The holding plate 20 is resiliently supported by the spring 48 and the pressing cover 50 is movably supported.

The leads 12 and the chip 1 are exposed through the window 22 of the holding plate 20. Since the window 22 is larger than the securing layer 32 on the substrate 30, the test probes 33 contact the leads 12 within the window 22 when the lead frame 10 moves down.

The cavity 52 of the pressing cover 50 is large enough to accommodate the chip 1, the bonding wires 14 and the adhesive tape 18 therein when the cover 50 presses down on the lead frame 10. In order to efficiently dissipate heat generated from the chip 1, openings (not shown) may be formed in the substrate 30 and the securing layer 32. As described previously, the guide pins 46 on the base 40 penetrate respective through holes in the holding plate 20 and the lead frame 10, and are inserted into the recess 56 of the pressing cover 50.

The driving means 60 operates to move the pressing cover 50 down, thereby pressing down on the lead frame 10. Accordingly, the lead frame 10 on the holding plate 20 also moves down as the spring 48 of FIG. 3 compresses. The lead frame 10 then contacts the test probes 33 on the substrate 30 in order to perform a suitable test procedure. After testing, the driving means 60 operates in the opposite direction and the pressing cover 50 is restored to its original position. The lead frame 10 is also restored as the spring 48 expands.

Figure 5:
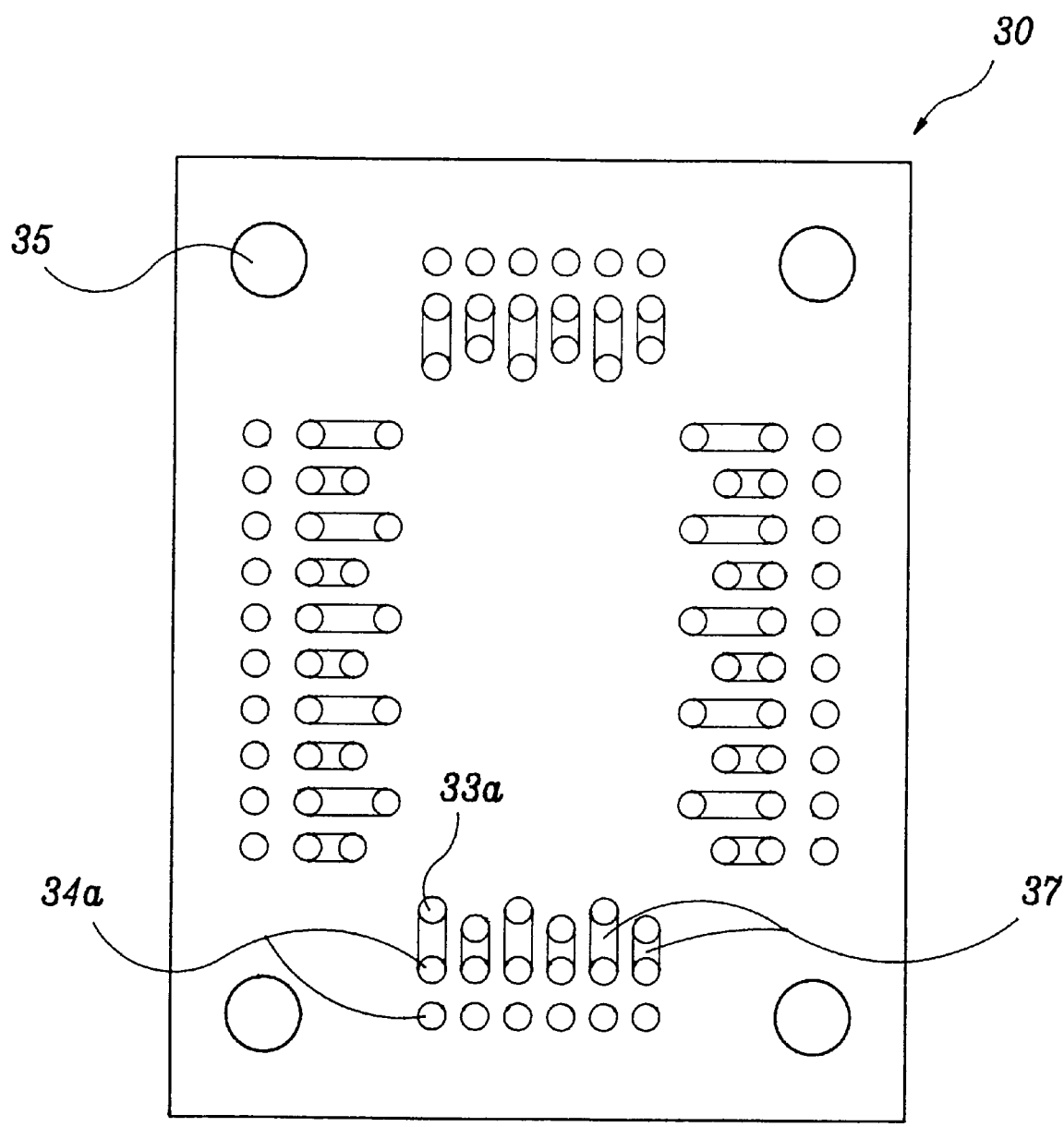
FIG. 5 is a plan view showing the bottom surface of a substrate in the testing apparatus according to the present invention.

FIG. 5 shows the bottom surface of the substrate 30 in the testing apparatus. As shown in FIG. 5, the substrate 30 has a plurality of probe holes 33a for the test probes, cable holes 34a for the cables and apertures 35 for fastening the substrate 30 on the base. Two cable holes 34a are formed for every one probe hole 33a. In the two cable holes 34a, signal input and output cable are respectively inserted. Reference numeral 37 designates a line for connecting the test probe 33 and the cable 34.

Figure 6A:
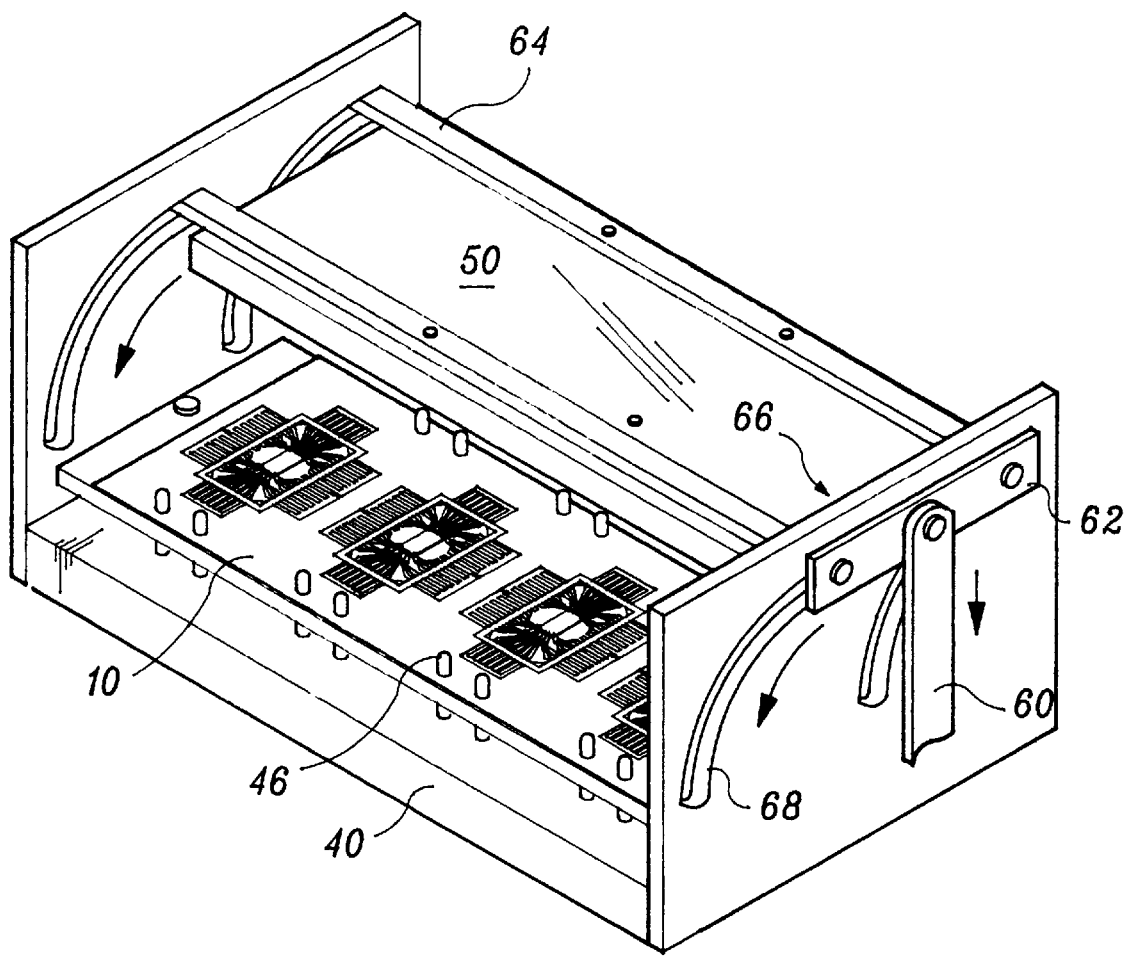
FIGS. 6A and 6B are perspective views illustrating the operation of a pressing cover of the testing apparatus according to the present invention.
Figure 6B:
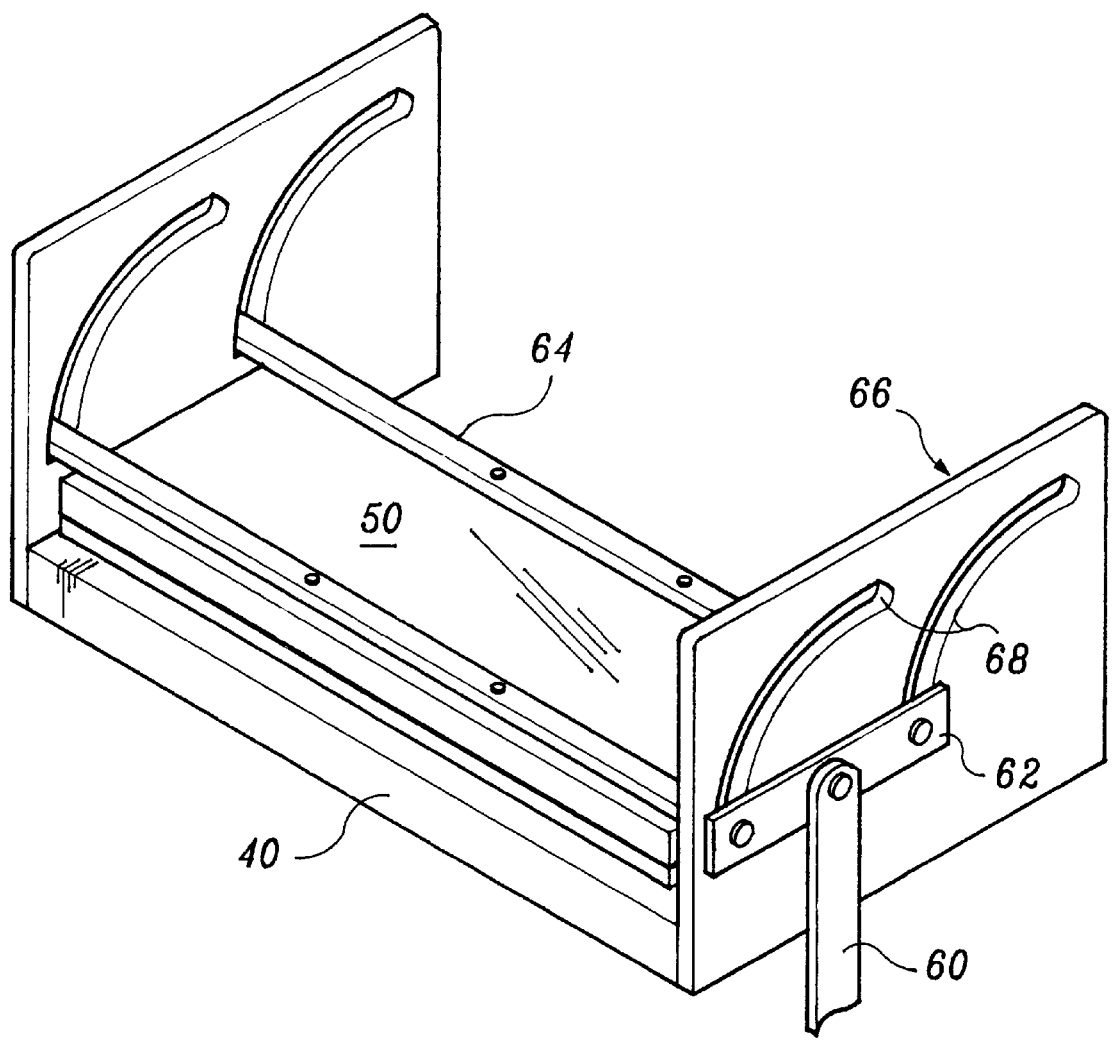

FIGS. 6A and 6B show the operation of the pressing cover 50 of the testing apparatus. Referring to FIGS. 6A and 6B, the driving means 60 may be, for example, a rod operated by a cylinder. Guide members 66 vertically extend from the base 40 to support the pressing cover 50, and the guide members 66 have oblique slits 68 formed therein. The pressing cover 50 is fixed to the driving means 60 by means of linking members 62, 64 through the oblique slits 68. Therefore, as the driving means 60 moves up and down in a perpendicular direction, the pressing cover 50 moves up and down, but it is tilted to one side along the oblique angle of the slit 68. This facilitates the loading or unloading of the lead frame 10.

Another embodiment of the testing apparatus 200 of the present invention will be described in detail with reference to FIGS. 7 and 8. Common elements in the present and previous embodiments are designated by common reference numbers in FIGS. 7 and 8. Accordingly, the common elements will not be discussed in detail, and the following discussion will relate primarily to the differences therebetween.

In FIGS. 7 and 8, a lead frame 110 including at least one non-packaged chip 1 may be put on the holding plate 20. Rather than the pogo pins 33 of the first embodiment, elastic bending leads 133 are provided as test probes for testing the chip 1. In this case, therefore, the securing layer 32 in the previous embodiment is not formed. Since the bending lead 133 has elastic force, its length can be minimized. Therefore, the electrical performance is improved due to the shorter length of signal route.

In the drawings and specification, there have been disclosed preferred embodiments of the invention and, although specific terms are employed, they are used in a generic and descriptive sense only and not for purposes of limitation, the scope of the invention being set forth in the following claims.

What is claimed is:

1. An apparatus for testing non-packaged semiconductor chips, comprising:

a lead frame having a plurality of leads, each of said leads being electrically isolated from the leads and physically supported by electrically non-conductive adhesive tape, wherein a non-packaged semiconductor chip to be tested is bonded to each of said leads by bonding wires;

a holding plate for supporting said lead frame, said holding plate having a plurality of windows centrally formed therein so that said leads of said lead frame are exposed therethrough;

a substrate located below said holding plate and having a plurality of test probes on an upper surface for respective contact with each of said leads of said lead frame through said windows of said holding plate, said substrate having a plurality of cables extending from a lower surface for connecting said test probes to external test signal generating circuits;

a base having a plurality of upper openings for receiving said substrate and a plurality of lower openings for passing said cables therethrough, wherein said upper openings are larger than said lower openings, whereby said substrate is inserted in said upper openings and then mounted; and a cover located above said lead frame, for pressing down on said lead frame so that said leads of said lead frame can be contacted with said test probes of said substrate, said pressing cover having at least one cavity for protecting said bonding wires.

2. The testing apparatus according to claim 1, further comprising:

means for moving said pressing cover, said moving means being fixed to said pressing cover, whereby said pressing cover moves up and down.

3. The testing apparatus according to claim 2, wherein said moving means includes at least one guide member extending vertically from said base and being attached to said pressing cover, said guide member have at least one oblique slit therein, through which said pressing cover is attached to said moving means.

4. The testing apparatus according to claim 1, further comprising:

at least one vertically extending guide pin on a peripheral portion of said base surrounding said upper openings, said guide pin extending through a corresponding guide hole in said lead frame.

5. The testing apparatus according to claim 4, wherein said pressing cover includes at least one recess for receiving said guide pin.

6. The testing apparatus according to claim 5, wherein said holding plate includes at least one through hole to allow said guide pin to pass therethrough.

7. The testing apparatus according to claim 1, wherein said leads of said lead frame are arranged in groups, each group of leads being bonded to the non-packaged semiconductor chip.

8. The testing apparatus according to claim 7, wherein each group of leads is electrically separated from the other groups of leads.

9. The testing apparatus according to claim 7, wherein each group of leads includes a respective pad for mounting said semiconductor chip thereon.

10. The testing apparatus according to claim 1, wherein said substrate includes a securing layer having a plurality of probe holes for respectively receiving said test probes.

11. The testing apparatus according to claim 10, wherein said test probes are resilient pogo pins.

12. The testing apparatus according to claim 1, wherein said test probes are elastic bending leads.

13. The testing apparatus according to claim 1, wherein said base includes at least one spring for resiliently joining said holding plate and said plate.

* * * * *